(12) United States Patent   (10) Patent No.: US 6,790,765 B1
Huang et al.   (45) Date of Patent: Sep. 14, 2004

(54) METHOD FOR FORMING CONTACT

(75) Inventors: Tse-Yao Huang, Taipei (TW); Yi-Nan Chen, Taipei (TW); Hui-Min Mao, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/720,275

(22) Filed: Nov. 25, 2003

(51) Int. Cl.⁷ ............................................. H01L 21/4763
(52) U.S. Cl. .................... 438/622; 438/258; 438/637
(58) Field of Search ................................ 438/622, 257, 438/258, 637, 638, 639, 620, 621

(56) References Cited

U.S. PATENT DOCUMENTS

| | | | | |
|---|---|---|---|---|
| 5,019,527 A | * | 5/1991 | Ohshima et al. | 438/257 |
| 5,966,602 A | * | 10/1999 | Kawazu et al. | 438/258 |
| 6,271,087 B1 | * | 8/2001 | Kinoshita et al. | 438/258 |
| 6,348,379 B1 | * | 2/2002 | Wang et al. | 438/257 |
| 2003/0211717 A1 | * | 11/2003 | Seo et al. | 438/586 |

* cited by examiner

*Primary Examiner*—Tuan H. Nguyen
(74) *Attorney, Agent, or Firm*—Birch, Stewart, Kolasch & Birch, LLP

(57) ABSTRACT

A method for forming contacts on a semiconductor device is provided. The method includes steps of forming an opening on a gate contact area, depositing a dielectric layer on a bit-line contact area and the opening, coating a photoresist to etch the dielectric layer, removing the photoresist and finally forming a conductive layer on a bit-line contact opening and a gate contact opening.

14 Claims, 9 Drawing Sheets

METHOD FOR FORMING CONTACT

FIELD OF INVENTION

The present invention relates to a method for forming contacts, and particularly, relates to a method for forming memory contacts on a semiconductor device.

BACKGROUND OF THE INVENTION

Most integrated circuits are manufactured by repeating several semiconductor processes, e.g. photolithographing, etching, depositing and doping, and are accomplished with many layers. To transmit signals among those layers, contacts and conductive lines are indispensable to modern semiconductor processes, especially for manufacturing memory chips. The contacts in a memory at least include bit-line contacts and gate contacts, and their manufacturing quality has great effect upon functions of the memory.

FIGS. 1–4 show the steps for forming contacts on a semiconductor device in the prior art. The contacts are positioned on a substrate 102 which has a bit-line contact area 100 and a gate contact area 200. FIG. 1A shows the bit-line contact area 100 which includes a first polysilicon layer 104, a conductive layer 106, a first dielectric layer 108, a side wall 110, a second dielectric layer 112, a third dielectric layer 114, a fourth dielectric layer 116 and a second polysilicon layer 118. FIG. 1B shows the gate contact area 200 which includes a third polysilicon layer 204, the conductive layer 106, a fifth dielectric layer 208, the fourth dielectric layer 116 and the second polysilicon layer 118.

Referring to FIG. 1A and FIG. 1B, the method of the prior art coats a photoresist 120 on the bit-line contact area 100 as well as the gate contact area 200, and then etches the two areas. Hence, a bit-line contact is formed on the bit-line contact area 100 as FIG. 2A shows; however, a gate contact is not formed yet insofar as FIG. 2B shows. The method of the prior art needs further steps of coating another photoresist 210 on the gate contact area 200, as FIG. 3A shows, and then etching the fifth dielectric layer 208 to form the gate contact as FIG. 3B shows.

This kind of semiconductor process causes the aspect ratio too small to facilitate photoresist removal.

SUMMARY OF THE INVENTION

The present invention provides a method for forming contacts on a semiconductor device, especially for forming memory contacts. The contacts mentioned herein are positioned on a substrate having a bit-line contact area and a gate contact area.

The method of the present invention includes the steps of forming an opening on the gate contact area, depositing a dielectric layer on the bit-line contact area and the opening, coating a photoresist to define a bit-line contact opening on the bit-line contact area and a gate contact opening on the gate contact area, etching the dielectric layer while using the photoresist as a mask to form the bit-line contact opening and the gate contact opening, removing the photoresist, and forming a conductive layer on the bit-line contact opening and the gate contact opening.

DETAILED DESCRIPTION

Figure 1A:
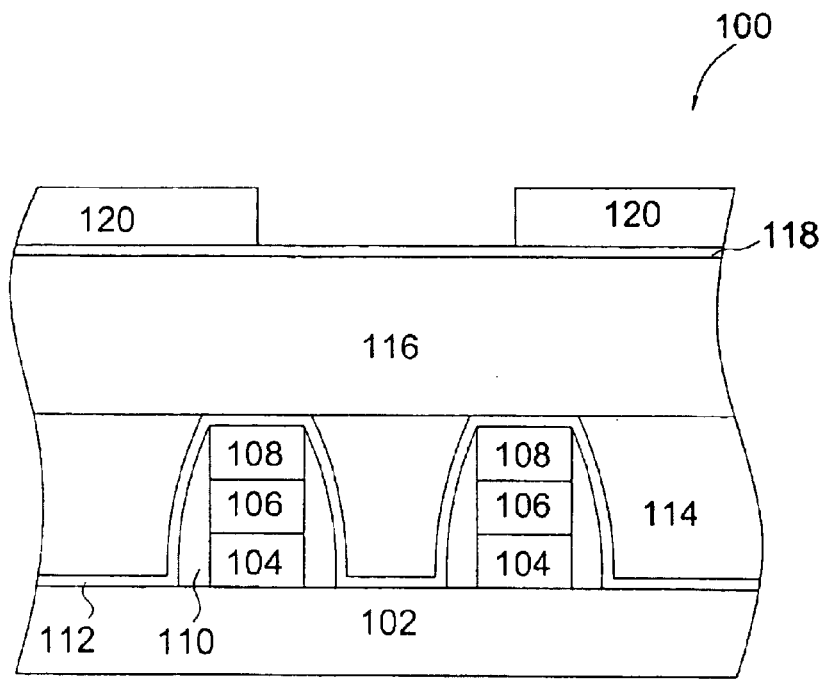
FIG. 1A illustrates a sectional view of the bit-line contact area in the prior art.
Figure 1B:
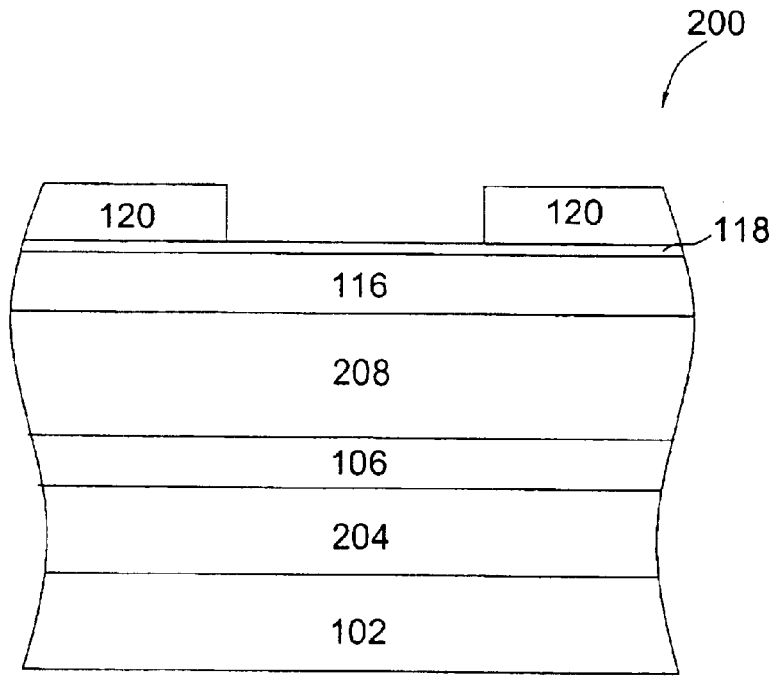
FIG. 1B illustrates a sectional view of the gate contact area in the prior art.
Figure 2A:
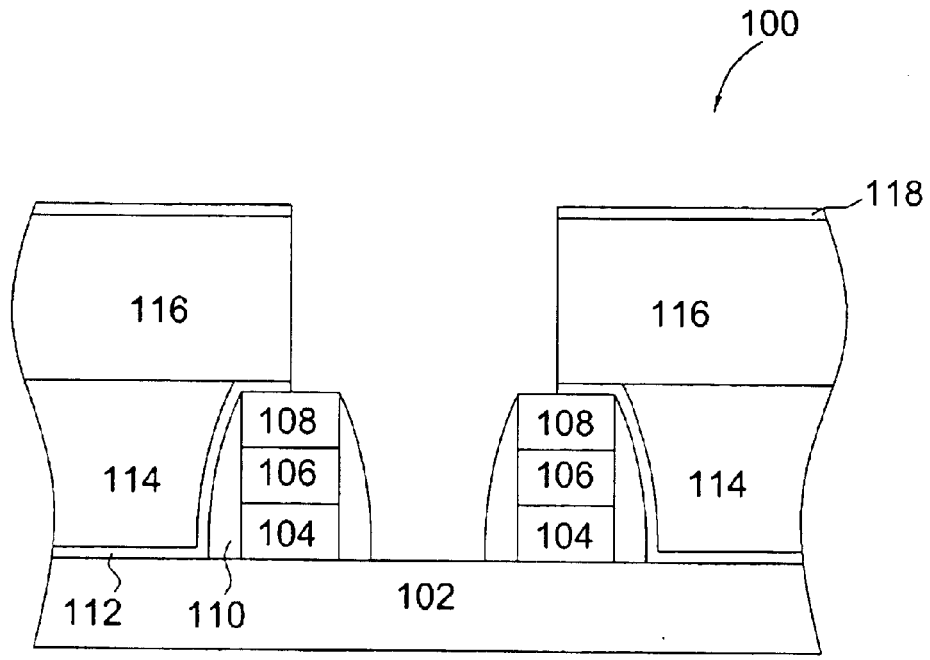
FIG. 2A and FIG. 2B illustrate sectional views for forming the bit-line contact opening in the prior art.
Figure 2B:
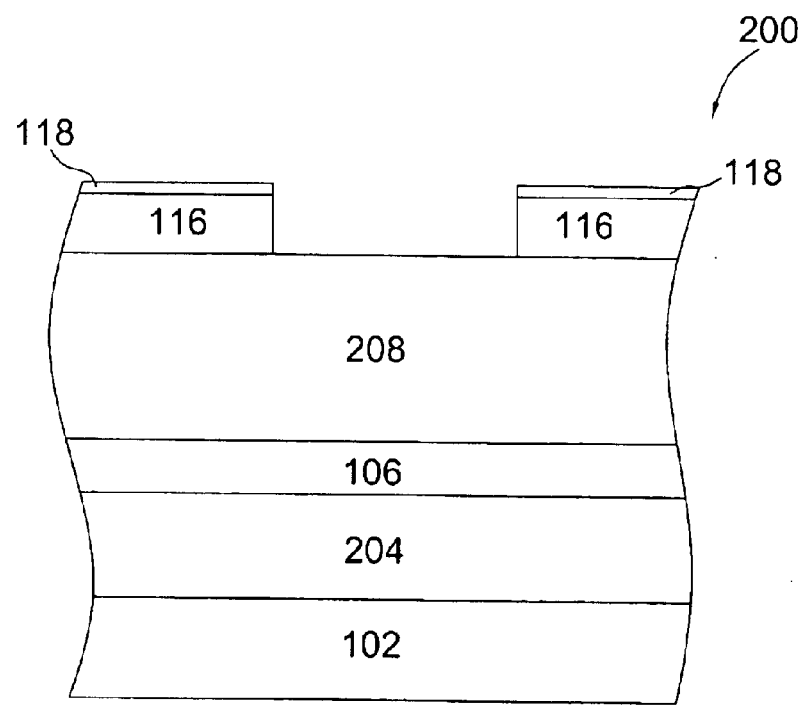
Figure 3A:
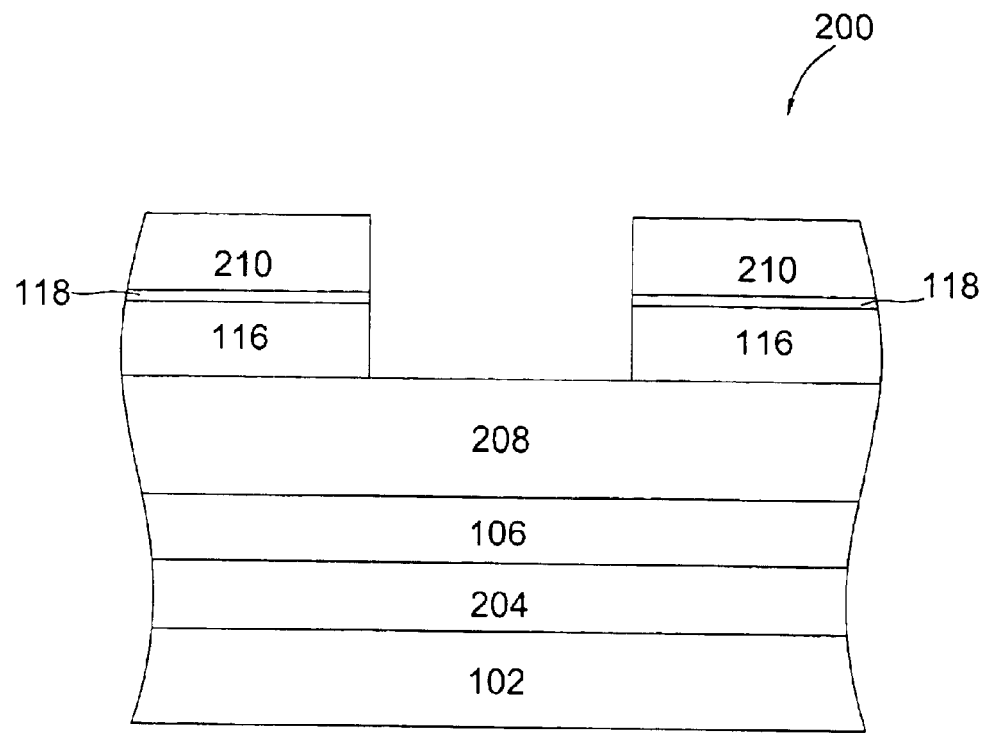
FIG. 3A and FIG. 3B illustrate sectional views for forming the gate contact opening in the prior art.
Figure 3B:
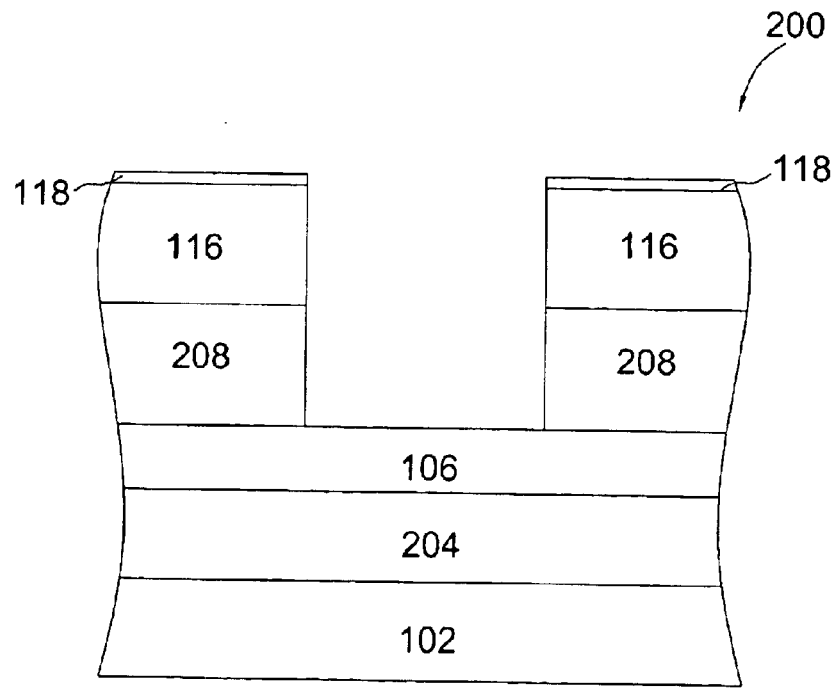
Figure 4A:
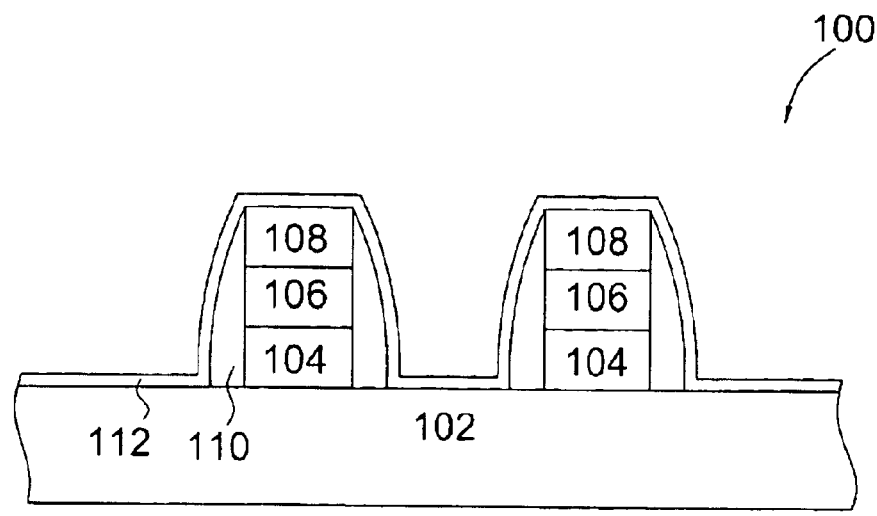
FIG. 4A illustrates a sectional view of the bit-line contact area of the present invention.
Figure 4B:
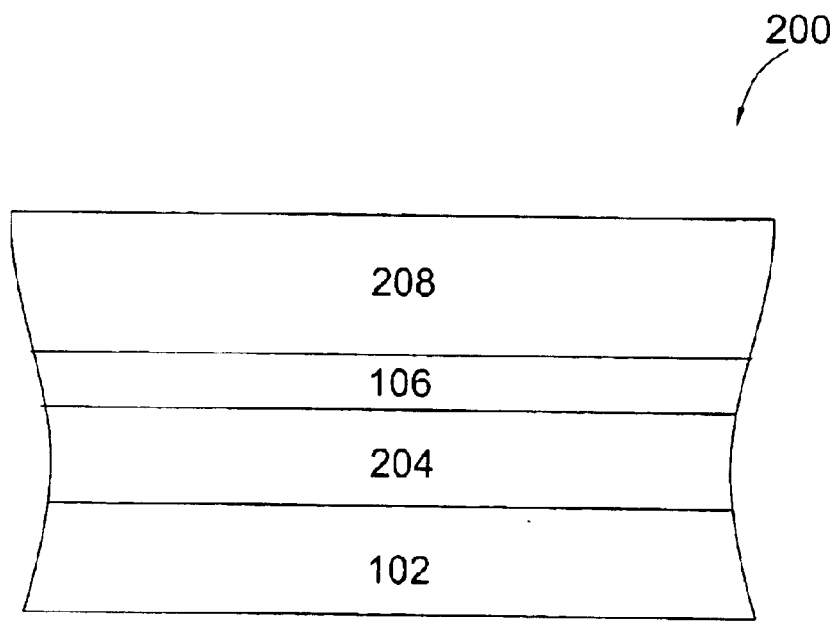
FIG. 4B illustrates a sectional view of the gate contact area of the present invention.

FIGS. 4–9 show an embodiment of the present invention. FIG. 4A shows the structure of a bit-line contact area 100 which includes a first polysilicon layer 104, a conductive layer 106, a first dielectric layer 108, a side wall 110 and a second dielectric layer 112. FIG. 4B shows the structure of a gate contact area 200 which includes a third polysilicon layer 204, the conductive layer 106 and a fifth dielectric layer 208.

Figure 5A:
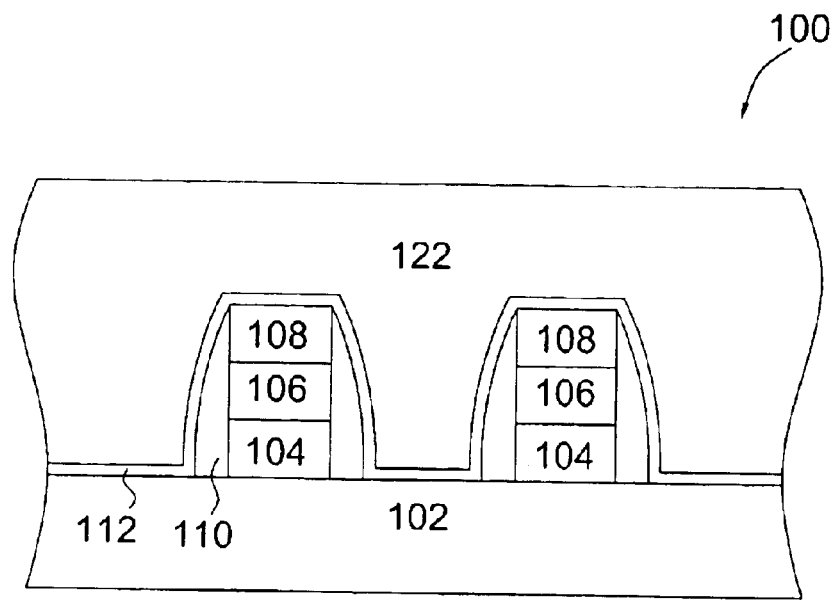
FIG. 5A and FIG. 5B illustrate sectional views for coating a photoresist to form an opening of the present invention.
Figure 5B:
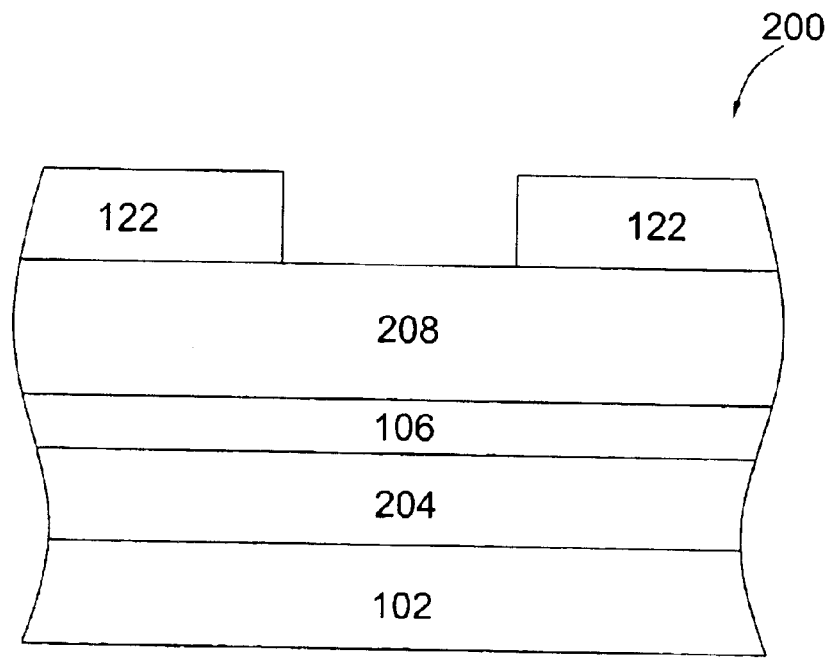
Figure 6A:
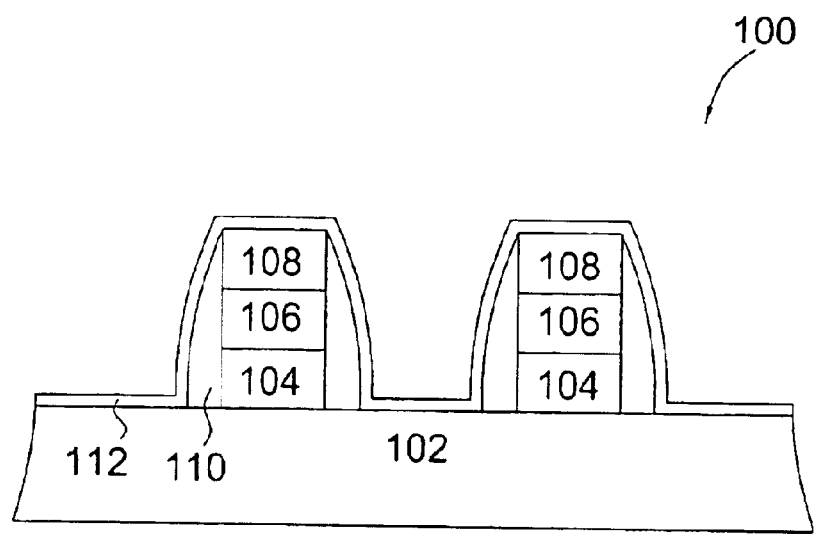
FIG. 6A and FIG. 6B illustrate sectional views after the photoresist is removed.
Figure 6B:
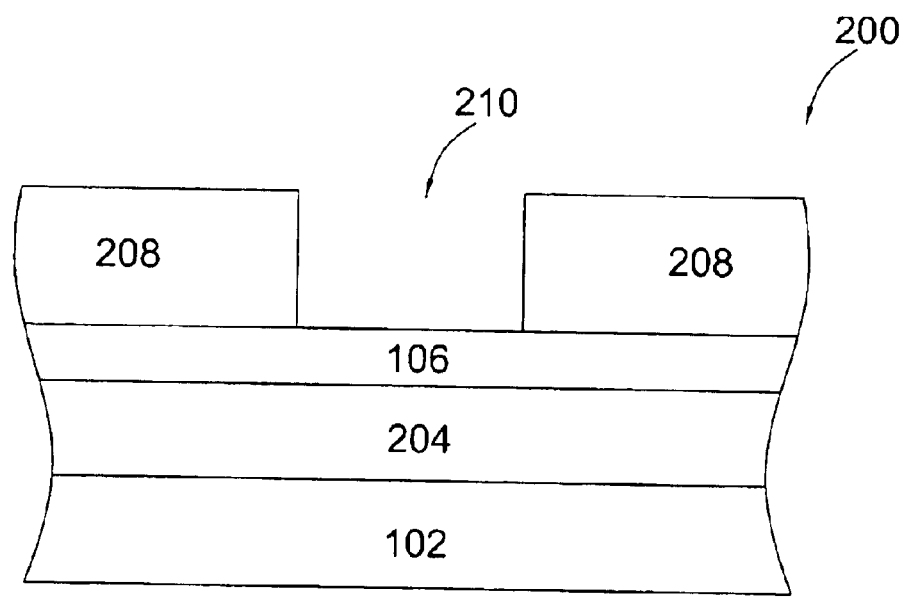

The method of the present invention includes the step of forming an opening on the gate contact area 200. As FIG. 5A and FIG. 5B show, the method coats a photoresist 122 on the bit-line contact area 100 and the gate contact area 200 to define an opening pattern on the gate contact area 200 by means of the photolithography technique of the prior art. Next, the method etches the fifth dielectric layer 208 and then removes the photoresist 122. As FIG. 6A shows, the structure of the bit-line contact area 100 does not change, but as FIG. 6B shows, the gate contact area 200 forms an opening 210.

Figure 7A:
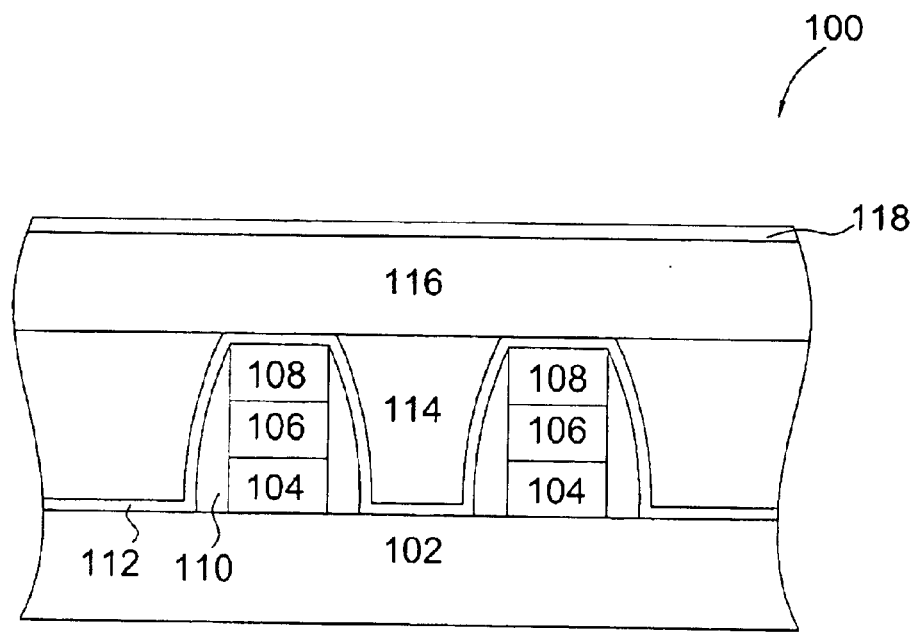
FIG. 7A and FIG. 7B illustrate sectional views for depositing a dielectric layer.
Figure 7B:
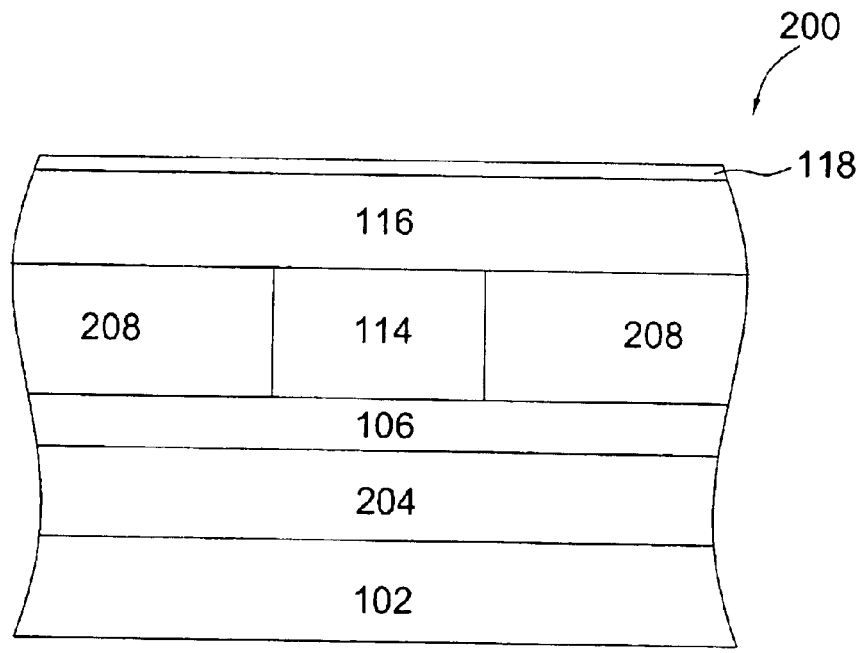

Then the method deposits a dielectric layer on the bit-line contact area 100 and the opening 210. As FIG. 7A and FIG. 7B show, the dielectric layer includes a third dielectric layer 114 and a fourth dielectric layer 116. In the embodiment, the third dielectric layer 114 is a borophospho-silicate glass (BPSG) layer. It is noted that an annealing process is preferably executed after the borophospho-silicate glass layer is deposited in order to reduce resistivity. The annealing temperature is 850~950° C. and the deposition depth of the borophospho-silicate glass layer on the bit-line contact area 100 after annealing is 2400~2500 Å. Moreover, the fourth dielectric layer 116 of the embodiment is a tetraethyl orthosilicate (TEOS) layer of a depth of 2600~4500 Å.

The method of the present invention further includes the step of forming a polysilicon layer 118 as a hard mask when etching the third dielectric layer 114 and the fourth dielectric layer 116.

Figure 8A:
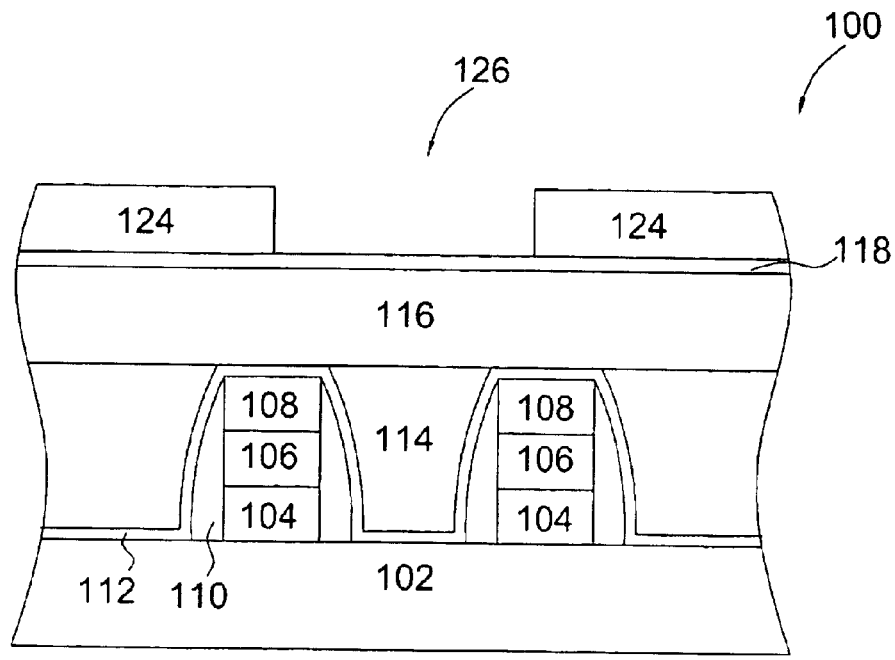
FIG. 8A and FIG. 8B illustrate sectional views for coating another photoresist.
Figure 8B:
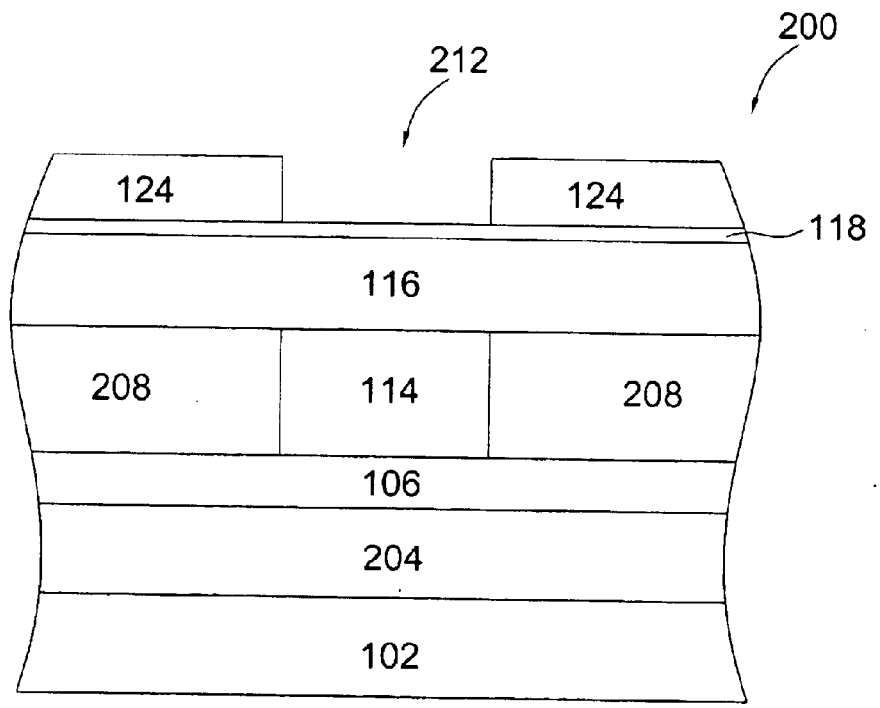
Figure 9A:
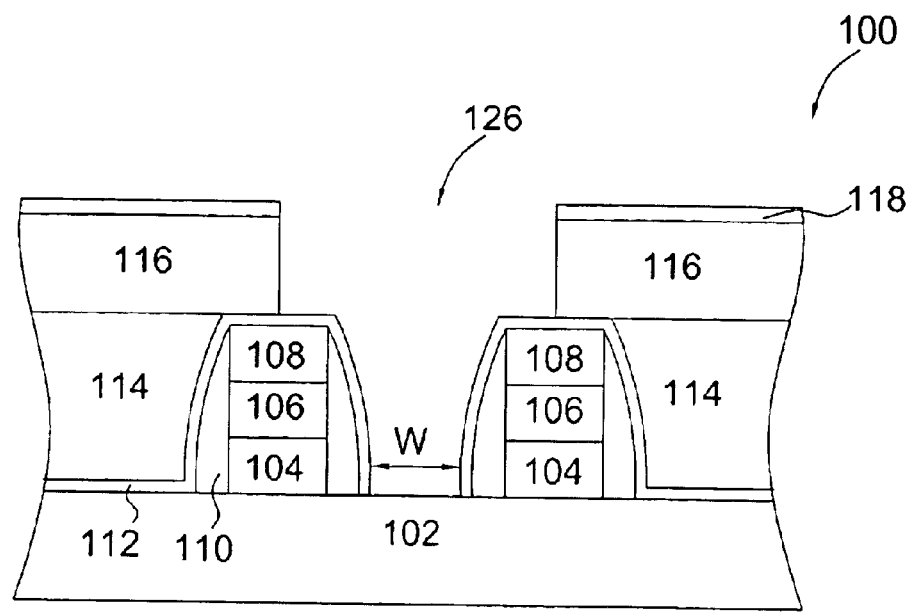
FIG. 9A and FIG. 9B illustrate sectional views for forming the bit-line contact and the gate contact.
Figure 9B:
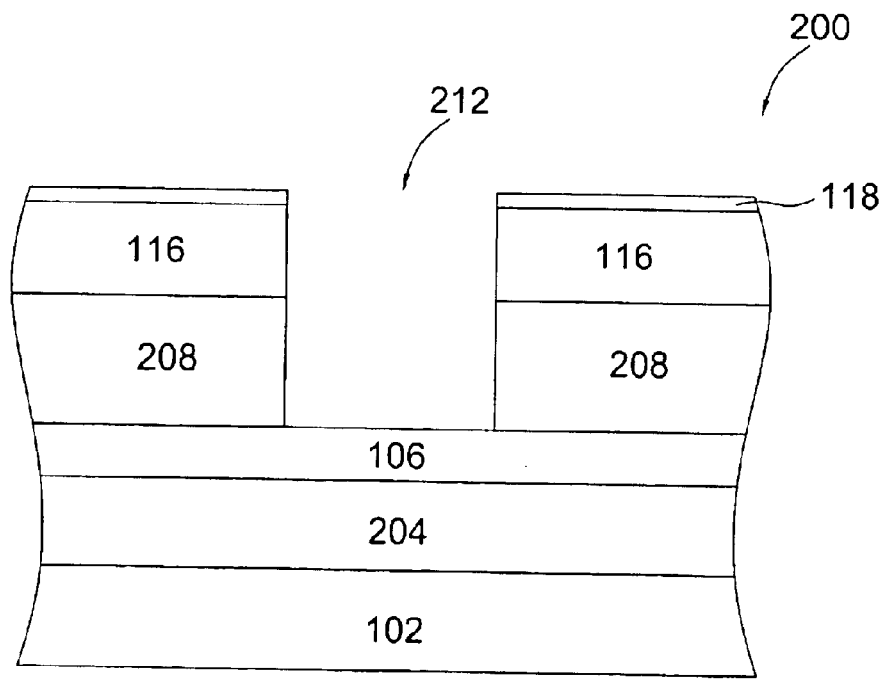

Referring to FIG. 8A and FIG. 8B, the method of the present invention coats another photoresist 124 to define a bit-line contact opening 126 on the bit-line contact area 100 and a gate contact opening 212 on the gate contact area 200. Then the third dielectric layer 114 and the fourth dielectric layer 116 is etched by using the photoresist as a mask to form the bit-line contact opening 126 and the gate contact opening 212. Next, the method removes the photoresist 124 so that the bit-line contact opening 126 and the gate contact opening 212 are accomplished as FIG. 9A and FIG. 9B show. Finally, a conductive layer is formed on the bit-line contact opening 126 and the gate contact opening 212 to be a medium for signal transmission.

The width W of the bit-line contact opening 126 made by the method of the present invention is 60~70 nm, which is 50~75% wider than that of the prior art. The larger aspect ratio facilitates photoresist removal.

The above description of the preferred embodiments is expected to clearly expound the characteristics of the present invention but not expected to restrict the scope of the present invention. Those skilled in the art will readily observe that numerous modifications and alteration of the apparatus may be made while retaining the teaching of the invention. Accordingly, the above disclosure should be construed as limited only by the bounds of the claims.

What is claimed is:

1. A method for forming a contact of a semiconductor device, the contact being positioned on a substrate, the substrate having a bit-line contact area and a gate contact area, the method comprising the steps of:

forming an opening on the gate contact area;

depositing a dielectric layer on the bit-line contact area and the opening;

coating a photoresist to define a bit-line contact opening on the bit-line contact area and a gate contact opening on the gate contact area;

etching the dielectric layer while using the photoresist as a mask to form the bit-line contact opening and the gate contact opening;

removing the photoresist; and forming a conductive layer on the bit-line contact opening and the gate contact opening.

2. The method of claim 1, wherein the depositing step further comprises:

depositing a borophospho-silicate glass (BPSG) layer;

annealing the borophospho-silicate glass layer, and depositing a tetraethyl orthosilicate (TEOS) layer.

3. The method of claim 2, wherein a deposition depth of the borophospho-silicate glass layer on the bit-line contact area after annealing is 2400~2500 Å.

4. The method of claim 2, wherein a deposition depth of the tetraethyl orthosilicate layer is 2600~4500 Å.

5. The method of claim 2, wherein a temperature for annealing the borophospho-silicate glass layer is 850~950° C.

6. The method of claim 1, further comprising forming a polysilicon layer as a hard mask between the depositing step and the coating step.

7. A method for forming a contact of a semiconductor device, the contact being positioned on a substrate, the substrate having a bit-line contact area and a gate contact area, the method comprising the steps of:

forming an opening on the gate contact area;

depositing a borophospho-silicate glass (BPSG) layer on the bit-line contact area and the opening;

annealing the borophospho-silicate glass layer;

depositing a tetraethyl orthosilicate (TEOS) layer;

coating a photoresist to define a bit-line contact opening on the bit-line contact area and a gate contact opening on the gate contact area;

etching the borophospho-silicate glass layer and the tetraethyl orthosilicate layer while using the photoresist as a mask to form the bit-line contact opening and the gate contact opening;

removing the photoresist; and forming a conductive layer on the bit-line contact opening and the gate contact opening.

8. The method of claim 7, wherein a deposition depth of the borophospho-silicate glass layer on the bit-line contact area after annealing is 2400~2500 Å.

9. The method of claim 7, wherein a deposition depth of the tetraethyl orthosilicate layer is 2600~4500 Å.

10. The method of claim 7, wherein a temperature for annealing the borophospho-silicate glass layer is 850~950° C.

11. The method of claim 7, further comprising forming a polysilicon layer as a hard mask between the step of depositing a tetraethyl orthosilicate layer and the coating step.

12. A method for forming a contact of a semiconductor device, the contact being positioned on a substrate, the substrate having a bit-line contact area and a gate contact area, the method comprising the steps of:

forming an opening on the gate contact area;

depositing a borophospho-silicate glass (BPSG) layer on the bit-line contact area and the opening;

annealing the borophospho-silicate glass layer under a temperature of 850~950° C.;

depositing a tetraethyl orthosilicate (TEOS) layer of a depth of 2600~4500 Å;

coating a photoresist to define a bit-line contact opening on the bit-line contact area and a gate contact opening on the gate contact area;

etching the borophospho-silicate glass layer and tile tetraethyl orthosilicate layer while using the photoresist as a mask to form the bit-line contact opening and the gate contact opening;

removing the photoresist; and forming a conductive layer on the bit-line contact opening and the gate contact opening.

13. The method of claim 12, wherein a deposition depth of the borophospho-silicate glass layer on the bit-line contact area after annealing is 2400~2500 Å.

14. The method of claim 12, further comprising forming a polysilicon layer as a hard mask between the step of depositing a tetraethyl orthosilicate layer and the coating step.

* * * * *